(12) United States Patent
Brinegar

(10) Patent No.: US 6,263,951 B1
(45) Date of Patent: Jul. 24, 2001

(54) HORIZONTAL ROTATING DIRECTIONAL SOLIDIFICATION

(75) Inventor: John R. Brinegar, Muskegon, MI (US)

(73) Assignee: Howmet Research Corporation, Whitehall, MI (US)

( * ) Notice: Subject to any disclaimer, the term of this patent is extended or adjusted under 35 U.S.C. 154(b) by 0 days.

(21) Appl. No.: 09/301,229

(22) Filed: Apr. 28, 1999

(51) Int. Cl.[7] ............... B22D 25/06; B22D 27/04; B22D 27/08
(52) U.S. Cl. ............... 164/71.1; 164/122.1; 164/122.2
(58) Field of Search ............... 164/122.1, 122.2, 164/71.1

(56) References Cited

U.S. PATENT DOCUMENTS

| | | | |
|---|---|---|---|
| 4,799,533 | 1/1989 | Ahrens et al. | 164/137 |
| 5,305,820 | 4/1994 | Tsuru et al. | 164/478 |
| 5,390,723 | 2/1995 | Mohla et al. | 164/57.1 |
| 5,477,906 | 12/1995 | Legge et al. | 164/122.1 |
| 5,605,186 | 2/1997 | Dusablon et al. | 164/97 |
| 5,622,218 | 4/1997 | Pedroza-Contreras | 164/472 |
| 5,626,180 | 5/1997 | Kahn et al. | 164/136 |
| 5,931,214 | 8/1999 | Spicer et al. | 164/258 |

FOREIGN PATENT DOCUMENTS

| | | |
|---|---|---|
| 2 105 750 | 2/1971 | (DE) . |
| 0 293 961 | 12/1988 | (EP) . |

OTHER PUBLICATIONS

"Growth of Nickel–base superalloy Bicrystals by the Seeding Technique with a Modified Bridgman Method", Journal of Crystal Growth, 179, pp. 635–646, 1997, Chen et al.

"Growth of III–V Ternary and Quaternary Mixed Crystals by Rotationary Bridgman Method" Journal of Crystal Growth, 109, pp. 212–217, 1991, Ozawa et al.

"Processing and Microstructure of Investment Casting Turbine Blade NITAC In–Situ Composites" Journal of Materials Engineering and Performance, 5, pp. 103–110, 1993, Fras et al.

*Primary Examiner*—Kuang Y. Lin

(57) ABSTRACT

Method and apparatus for directional solidification of molten metal using a general horizontally oriented mold initially positioned in a casting furnace. The mold is filled with molten metal through a mold pour cup located on an upper region of the mold and a pour cup runner that enters the mold at location proximate a grain selection passage. The melt filled mold initially is withdrawn from the casting furnace to solidify the molten metal at the location where the pour cup runner enters the mold. The melt filled mold then is withdrawn while the mold is rotated about its horizontal axis to reduce segregation of alloying elements in the solidifying molten metal. Initial solidification of molten metal at the entry of the pour cup runner to the mold prevents molten metal from flowing out of the mold through the pour cup when the mold is subsequently rotated.

16 Claims, 1 Drawing Sheet

HORIZONTAL ROTATING DIRECTIONAL SOLIDIFICATION

FIELD OF THE INVENTION

The present invention relates to horizontal directional solidification of molten metals.

BACKGROUND OF THE INVENTION

Directional solidification of molten metal using a vertically oriented ceramic mold positioned on a horizontal chill plate is well known in the art of investment casting to produce such components as columnar grain or single crystal gas turbine engine blades and vanes. Typically, the vertically oriented mold on the chill plate is filled with molten metal in an upstanding casting furnace, and then the chill plate is vertically withdrawn from the casting furnace to establish unidirectional heat removal from the molten metal in the mold to produce a columnar or single crystal casting microstructure if a crystal selector passage (e.g. pigtail) is provided on the mold.

An object of the present invention is to provide method and apparatus for directional solidification using a generally horizontally oriented mold that is withdrawn from a casting furnace and rotated in a manner to reduce segregation, avoid loss of molten metal from the mold, and achieve a directionally solidified cast microstructure.

SUMMARY OF THE INVENTION

The present invention provides in an embodiment method and apparatus for directional solidification of molten metal using a general horizontally oriented mold initially positioned in a casting furnace. The mold is filled with molten metal through a mold pour cup located on an upper region of the mold and a pour cup runner that enters the mold at a location. The melt filled mold initially is withdrawn from the casting furnace to solidify the molten metal at the location where the pour cup runner enters the mold. The melt filled mold then is withdrawn while the mold is rotated about its horizontal axis to reduce segregation of alloying elements in the solidifying molten metal. Initial solidification of molten metal at the entry of the pour cup runner to the mold prevents molten metal from flowing out of the mold through the pour cup when the mold is subsequently rotated.

The above and other objects and advantages of the present invention will become more readily apparent from the following drawings taken in conjunction with the following detailed description.

DESCRIPTION OF THE INVENTION

Figure 1:
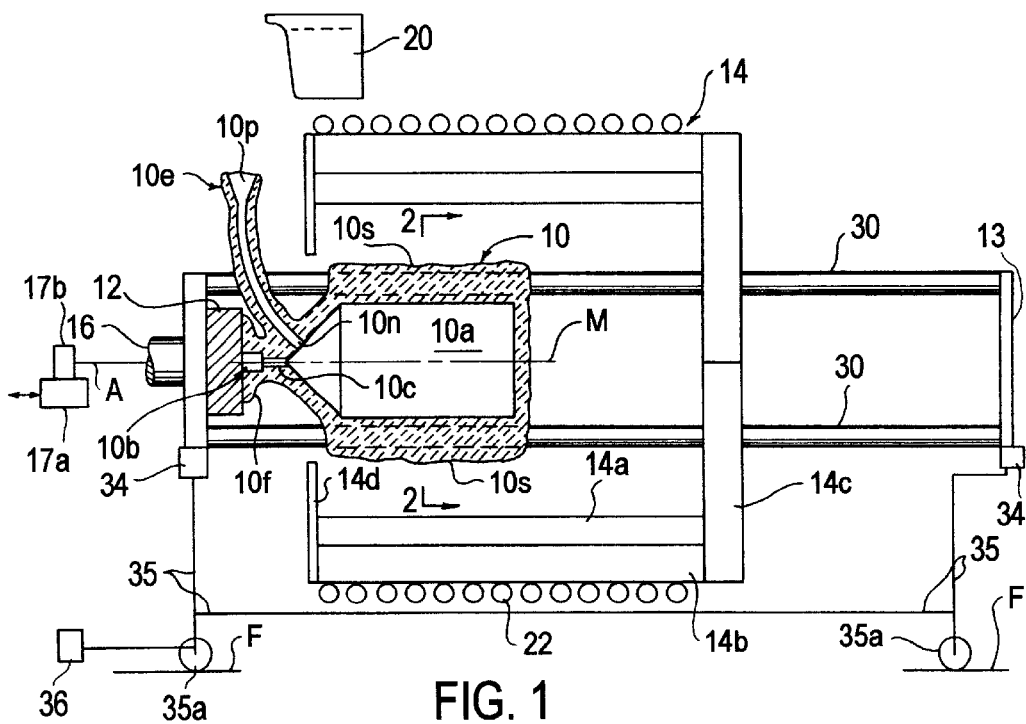
FIG. 1 is a schematic view, partially in section, of directional solidification apparatus pursuant to an embodiment of the invention.
Figure 2:
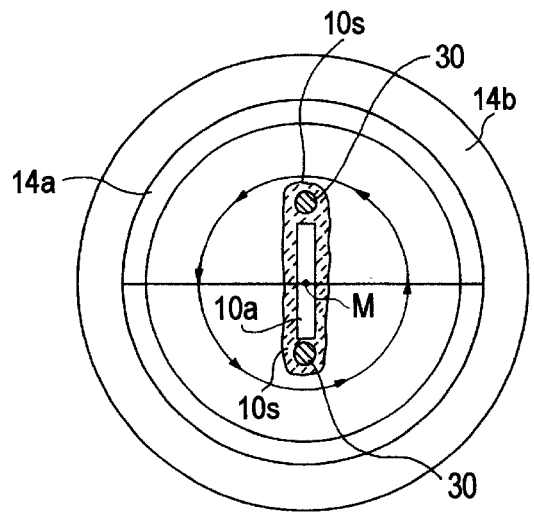
FIG. 2 is a schematic sectional view along lines 2—2 of FIG. 1 showing rotational motion of the mold.

Referring to FIGS. 1 and 2, an illustrative embodiment of the present invention involves method and apparatus for directional solidification of molten metal using a general horizontally oriented refractory mold 10 initially positioned on a metal chill 12 to reside in a casting furnace 14. By generally horizontal is meant that the mold 10 can reside with its longitudinal mold axis M in a horizontal plane or near horizontal plane where the mold axis M is slightly inclined from horizontal by up to 45 degrees, for example. The mold 10 can comprise a conventional ceramic investment shell mold made by repeatedly dipping a fugitive (e.g. wax) pattern of the article to be cast in ceramic slurry, draining excess slurry, and stuccoing the slurry-coated pattern with ceramic stucco particulates to build up a shell mold of desired mold wall thickness on the pattern. The pattern is removed thermally, such as melting, dissolution or other means to leave a ceramic shell mold which is fired at elevated temperature prior to casting to develop suitable mold strength for casting.

The ceramic shell mold 10 is formed to include an article-forming mold cavity 10a, a grain starter chamber 10b, and a grain or crystal selector passage 10c communicating the grain starter chamber 10b to the mold cavity 10a to select a single grain to propagate from the grain starter chamber 10b through the mold cavity 10a to form a single cyrstal casting therein. Alternately, the passage 10c may be omitted to form columnar grain castings whereby the grain starter chamber 10b communicates directly to the mold cavity 10a.

The shell mold 10 includes an integral or attached pour cup 10e that is communicated to the mold cavity 10a to introduce molten metal into the mold 10 to fill mold cavity 10a, grain starter chamber 10b, and passage 10c with molten metal. The pour cup includes an enlarged top cup 10p that receives molten metal from a crucible or other melting or melt-holding vessel 20 and an elongated pour cup runner passage 10n that preferably communicates to the mold cavity 10a proximate the passage 10c (or chamber 10b for columnar grain castings), although the runner passage 10n can commnicate with the mold interior at other locations, such as mold cavity 10a depending on geometry of the casting to be made. The pour cup 10e is shown located on an upper region of the shell mold 10 and extending outside of the casting furnace 14 to receive molten metal from the melting or melt-holding vessel 20. Alternately, the pour cup 10e can be connected to an upper region of the mold 10 within the furnace 14 if molten metal can be supplied to the pour cup 10e within the furnace.

The shell mold 10 includes flange 10f that is clamped by clamps (not shown) on the chill 12, which can comprise water cooled copper chill plate oriented vertically as shown. The chill plate 12 is connected to a ram 16 that is moved horizontally (axially) and also is rotated 360 degrees about its longitudinal horizontal axis A by a suitable combination of linear and rotary fluid, electric or other actuators shown schematically at 17a and 17b. For example, a rotary actuator can be mounted on a linear slide actuator to achieve the linear and rotary motion of the ram 16. Alternatively, the furnace may be moved horizontally by a suitable actuator while the chill plate and mold are rotated.

The casting furnace 14 comprises an inner tubular graphite susceptor 14a that is heated by energization of the induction coil 22 disposed about the furnace 14. The furnace includes a refractory sleeve 14b surrounding the susceptor 14a and an end closure 14c to close off the end of the furnace. Annular heat baffle 14d is disposed at the other end of the furnace 14 where the mold 10 is withdrawn on chill plate 12 by axial movement of ram 16 to enhance the thermal gradient in the molten metal as the mold 10 is withdrawn from the furnace 14.

Directional solidification is effected by filling the horizontally oriented mold 10 residing on the chill plate 12 as shown in FIG. 1 with molten metal via the pour cup 10e. In accordance with the invention, the melt filled mold 10 is initially gradually withdrawn horizontally without mold rotation from the furnace 14 by axial movement of the ram 16 past the heat baffle 14d to achieve solidification of the molten metal in the grain starter chamber 10b (for columnar grain casting) or grain selection passage 10c (for single crystal casting) and at the entry location of the pour cup runner passage 10n into the mold. Thereafter, the melt filled mold 10 is rotated 360 degrees about the general horizontal mold axis M and coaxial ram axis A during remaining mold withdrawal as indicated by the arrow in FIG. 2 to reduce segregation of alloying elements in the solidifying molten metal. The initial solidification of the molten metal in chamber 10b or passage 10c and at the entry location of runner passage 10n into the mold prevents molten metal in the mold 10 from inadvertently flowing out of the mold through the pour cup 10e during mold rotation. Such simultaneous ram axial movement and rotation can be conducted while the melt filled mold 10 is supported on a pair of parallel rods 30 that extend through longitudinal passages formed in side flanges 10s of the mold. The rods 30 are fastened at one end to chill plate plate 12, or other plate, on the ram by any suitable fastening means and to another end plate 13 by any suitable fastening means with the plates 12, 13 positioned for rotation on bushings or bearings 34 on a linear travelling carriage 35 that is moved linearly with the ram 16 by any suitable actuator 36 to follow linear movement of the ram 16. The end closure 14c includes apertures for receiving the rods 30. The carraige 35 includes wheels 35a that ride on a support floor F.

The melt filled mold 10 is withdrawn axially from the furnace 14 and rotated until the molten metal in mold cavity 10a is solidified to have a desired columnar grain or single crystal microstructure. A withdrawal rate and revolution speed can be selected as desired to reduce segregation while unidirectionally solidifying the melt in the mold 10. The mold 10 can be fabricated with a mold wall that is thinner than the mold wall thickness used for investment casting with the mold oriented vertically because of a reduction in metallostatic head or pressure in the horizontal melt-filled mold 10. For example, an investment casting mold for an industrial gas turbine engine blade can be 4 feet tall when oriented vertically for casting but is only 1 foot tall when oriented horizontally on its side for casting to reduce molten metallostatic pressure on the mold during casting.

Although the invention has been described in detail above with respect to certain embodiments, those skilled in the art will appreciate that modifications, changes and the like can be made therein without departing from the spirit and scope of the invention as set forth in the appended claims.

I claim:

1. A method of directional solidification of molten metal, comprising relatively moving a casting furnace and a mold having a generally horizontally oriented, longitudinal mold axis and a molten metal filled mold cavity received initially in the casting furnace to solidify molten metal proximate an entry passage to the mold cavity and then relatively moving said mold and said casting furnace while rotating said mold about said mold axis to effect directional solidification of the molten metal in the mold cavity.

2. The method of claim 1 including filling the mold with molten metal as it resides adjacent a chill in the casting furnace through the passage located on an upper region of the mold.

3. The method of claim 2 wherein the passage extends from the mold to a position outside or inside the casting furnace where the molton metal is introduced into the passage for flow into the mold residing in the furnace.

4. The method of claim 1 including relatively moving said mold having said mold axis that is horizontal or oriented up to 45 degrees relative to horizontal.

5. The method of claim 1 wherein said mold and said casting furnace are relatively moved in a direction of said mold axis.

6. The method of claim 1 wherein said mold and said casting furnace are relatively moved to withdraw said mold from said casting furnace to effect said directional solidification.

7. The method of claim 2 including rotating said chill with said mold.

8. The method of claim 1 wherein said mold axis is oriented in a same direction as a grain selector passage of said mold.

9. The method of claim 1 wherein said mold axis is oriented in a same direction as a grain starter chamber of said mold.

10. Directional solidification apparatus, comprising a casting furnace, a mold having a generally horizontally oriented, longitudinal mold axis, a mold cavity containing molten metal and an entry passage above and extending to the mold cavity, said mold cavity residing initially in the casting furnace, a first actuator for relatively linearly moving the mold and the casting furnace to initially solidity the molten metal proximate the entry passage prior to rotation of the mold, and a second actuator for rotating the mold about said mold axis following solidification of the molten metal proximate the entry passage and as said first actuator further relatively moves the mold and the casting furnace to effect directional solidification of the molten metal in the mold cavity.

11. The apparatus of claim 10 wherein the mold resides adjacent a chill located outside of the casting furnace and connected to a ram.

12. The apparatus of claim 10 wherein said mold axis is horizontal or is oriented up to 45 degrees relative to horizontal.

13. The apparatus of claim 10 wherein the mold includes a pour cup communicated to said passage at an upper region of the mold.

14. The apparatus of claim 10 wherein the entry passage extends from the mold to a position outside the casting furnace where the molten metal is introduced into the passage for flow into the mold residing in the furnace.

15. The apparatus of claim 10 wherein the entry passage is proximate a grain selection passage between a grain starter chamber and the mold cavity, said mold axis extending in a same direction as said grain starter chamber and said grain selector passage.

16. The apparatus of claim 10 wherein the entry passage is proximate a grain starter chamber, said mold axis extending in a same direction as said grain starter chamber.

* * * * *